(12) United States Patent
Sheffield et al.

(10) Patent No.: US 8,123,927 B1
(45) Date of Patent: Feb. 28, 2012

(54) REDUCED CIRCUIT TRACE ROUGHNESS FOR IMPROVED SIGNAL PERFORMANCE

(75) Inventors: Robert Sheffield, Ottawa (CA); Eileen Goulet, Gatineau (CA)

(73) Assignee: Rockstar Bidco, LP, New York, NY (US)

( * ) Notice: Subject to any disclaimer, the term of this patent is extended or adjusted under 35 U.S.C. 154(b) by 1439 days.

(21) Appl. No.: 10/667,491

(22) Filed: Sep. 23, 2003

(51) Int. Cl.
*C25D 5/48* (2006.01)

(52) U.S. Cl. ....................................................... 205/220

(58) Field of Classification Search .................. 205/123, 205/157, 220–223, 640
See application file for complete search history.

(56) References Cited

U.S. PATENT DOCUMENTS

| | | | | |
|---|---|---|---|---|
| 4,959,507 A | * | 9/1990 | Tanaka et al. | 174/260 |
| 5,046,238 A | * | 9/1991 | Daigle et al. | 29/830 |
| 5,273,938 A | * | 12/1993 | Lin et al. | 438/107 |
| 6,309,528 B1 | * | 10/2001 | Taylor et al. | 205/103 |
| 6,476,330 B2 | | 11/2002 | Otsuka et al. | |
| 6,558,231 B1 | * | 5/2003 | Taylor | 451/36 |
| 6,750,144 B2 | * | 6/2004 | Taylor | 438/678 |
| 2002/0060090 A1 | * | 5/2002 | Ozeki et al. | 174/255 |
| 2002/0155021 A1 | * | 10/2002 | Nagai et al. | 420/492 |
| 2003/0006063 A1 | | 1/2003 | Otsuka et al. | |
| 2003/0096082 A1 | | 5/2003 | Nagai et al. | |
| 2003/0108766 A1 | | 6/2003 | Nagai | |

* cited by examiner

*Primary Examiner* — Luan Van
(74) *Attorney, Agent, or Firm* — Hunton & Williams, LLP

(57) ABSTRACT

Exemplary techniques for improving the performance of signals transmitted by conductive circuit traces are disclosed. The techniques may be realized as a method comprising the step of reducing a surface roughness of at least one surface of a conductive circuit trace. Alternatively, the techniques may be realized as a circuit board for transmitting at least one signal, the circuit board comprising at least one conductive circuit trace for carrying at least one signal, the at least one conductive circuit trace having at least one polished surface. Further, the technique may be realized as a conductive circuit trace for carrying a signal, the conductive circuit trace comprising conductive material having a plurality of surfaces substantially parallel with a direction of propagation of the signal, wherein the plurality of surfaces includes at least one polished surface having a reduced surface roughness.

8 Claims, 4 Drawing Sheets

REDUCED CIRCUIT TRACE ROUGHNESS FOR IMPROVED SIGNAL PERFORMANCE

FIELD OF THE INVENTION

The present invention relates generally to signal transmission via circuit traces in single-layer or multilayer circuit boards and, more particularly, to a technique for reducing the surface roughness of a circuit trace to improve the performance of a signal transmitted therein.

BACKGROUND OF THE INVENTION

Conductors transmitting signals often exhibit a phenomenon known as "skin effect" whereby the self-inductance of the conductors forces electrons toward the surface of the conductors. Skin effect is particularly prevalent in conductors transmitting high-frequency signals. For example, it has been found that for a copper conductor, the depth from the surface at which the majority of the electrons flow (i.e., the "skin depth") is approximately 2 microns for a 1 gigahertz (GHz) signal, 0.66 microns for a 10 GHz signal, and 0.33 microns for a 40 GHz signal.

Skin effect restricts current to only a relatively small portion of the total cross-sectional area of a conductor. Conductors, however, frequently exhibit a surface roughness that may extend into the skin depth of the conductors. As a result of this surface roughness, the mean free path traveled by electrons exhibiting skin effect increases in length as the electrons travel up and down the contours of the rough surface of the conductor. This increase in the effective signal path results in a corresponding increase in the resistance to the flow of the current and transmission time and, consequently, a decrease in the signal reach and performance.

In view of the foregoing, it would be desirable to provide a technique for conditioning conductive circuit traces exhibiting the skin effect phenomenon that overcomes the above-described inadequacies and shortcomings in an efficient and cost effective manner.

SUMMARY OF THE INVENTION

According to the present invention, a technique for improving signal performance in conductive circuit traces is provided. The technique may be realized by the use of chemical polishing, electropolishing, or other polishing technique to achieve a polished finish by reducing both lateral and transverse fabrication roughness. Surface polishing, along with the use of low profile adhesion promoters substantially improves high speed signal propagation for metal on dielectric circuit boards.

In one embodiment, the technique may be realized as a method for improving performance of a signal transmitted via a conductive circuit trace of a circuit board. The method comprises the step of reducing a surface roughness of at least one surface of the conductive circuit trace.

In another embodiment, the technique may be realized as a circuit board for transmitting at least one signal, the circuit board comprising at least one conductive circuit trace for carrying at least one signal, the at least one conductive circuit trace having at least one polished surface.

In yet another embodiment, the technique may be realized as a conductive circuit trace for carrying a signal. The conductive circuit trace comprises conductive material having a plurality of surfaces substantially parallel with a direction of propagation of the signal, wherein the plurality of surfaces includes at least one polished surface having a reduced surface roughness.

The at least one surface of the conductive circuit trace may include a surface parallel and distal to a surface of the circuit board, a surface parallel and proximal to the surface of the circuit board or a surface perpendicular to the surface of the circuit board. The at least one polished surface may be polished using electropolishing, chemical polishing, electroplating or vacuum deposition. The surface roughness of the at least one surface preferably is reduced to no more than 20 microinches RMS, more preferably is reduced to no more than 10 microinches RMS, and most preferably reduced to no more than 5 microinches root-mean-squared RMS.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

The following description is intended to convey a thorough understanding of the present invention by providing a number of specific embodiments and details involving polishing conductive circuit traces in circuit boards and other circuit devices. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1A-3 illustrate various exemplary techniques for polishing circuit traces of a printed circuit board (PCB) to improve the performance of signals transmitted therein. In at least one embodiment, one or more surfaces of one or more conductive circuit traces of a PCB may be polished to reduce their surface roughness. Consequently, the mean free path traveled by electrons at skin depth of the conductor may be reduced compared to an unpolished circuit trace. This reduction in the distance traveled by electrons through the circuit trace typically results in a reduction of resistance to the current caused by the conductive circuit trace and, therefore, increases in the signal reach and signal performance.

The term surface roughness generally refers to the frequency and/or magnitude of projections and depressions at a surface of a material that cause the surface to deviate from a level line representing absolute smoothness. A variety of techniques may be used to measure surface roughness, including surface profilometry by stylus trace or Atomic Force Microscopy resulting in the root-mean-squared (RMS) or the centerline average (CLA) roughness value. The term polish refers to any of a variety of techniques used to reduce the surface roughness of metals and other conductors, including but not limited to, electropolishing, chemical polishing, electrochemical polishing, chemical-mechanical polishing, mechanical polishing, electroplating, and vacuum deposition. The term high frequency generally refers to a frequency range where the amplitude of the surface roughness equals or exceeds the skin depth in the conductor. Although the present invention is not limited to any particular frequency range, typical frequency ranges that result in significant signal deterioration due to the skin effect include frequencies from 1 Megahertz (MHz) to hundreds of Gigahertz (GHz), depending at least in part on the properties of the conductor.

Figure 1A:
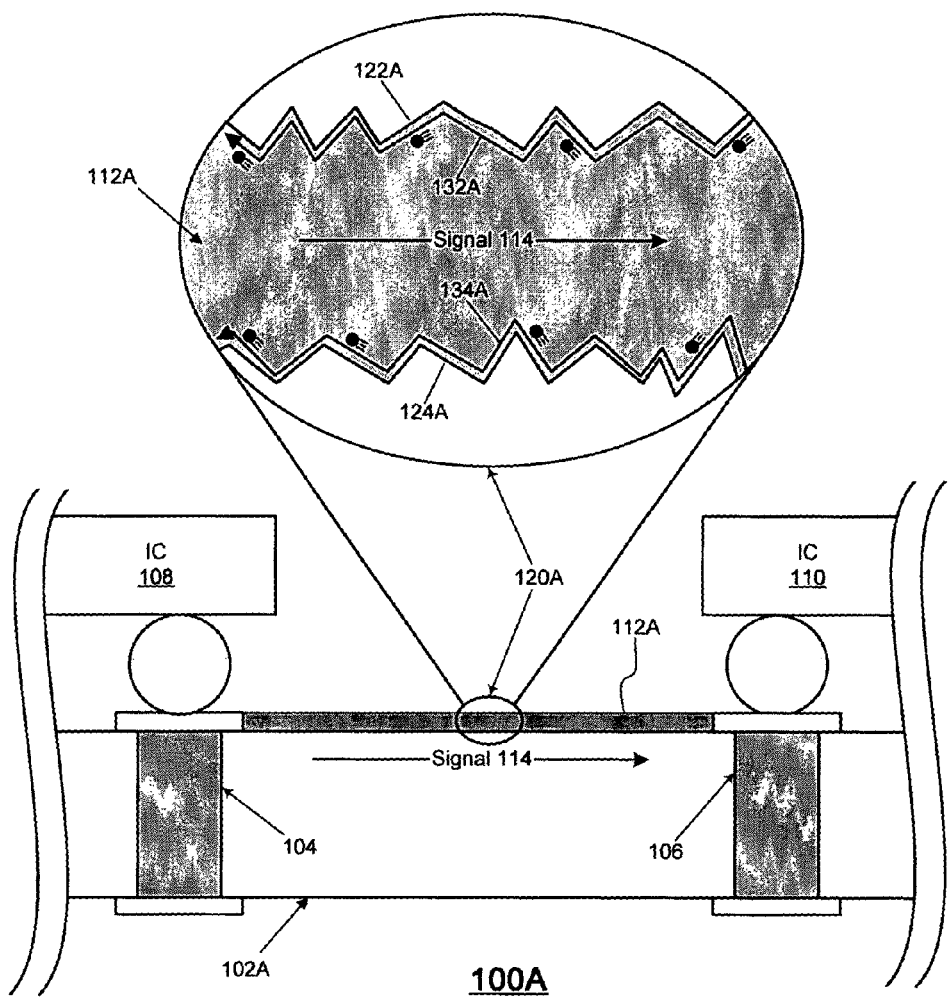
FIG. 1A is a cross-section view illustrating an exemplary printed circuit board (PCB) having an unpolished circuit trace in accordance with at least one embodiment of the present invention.
Figure 1B:
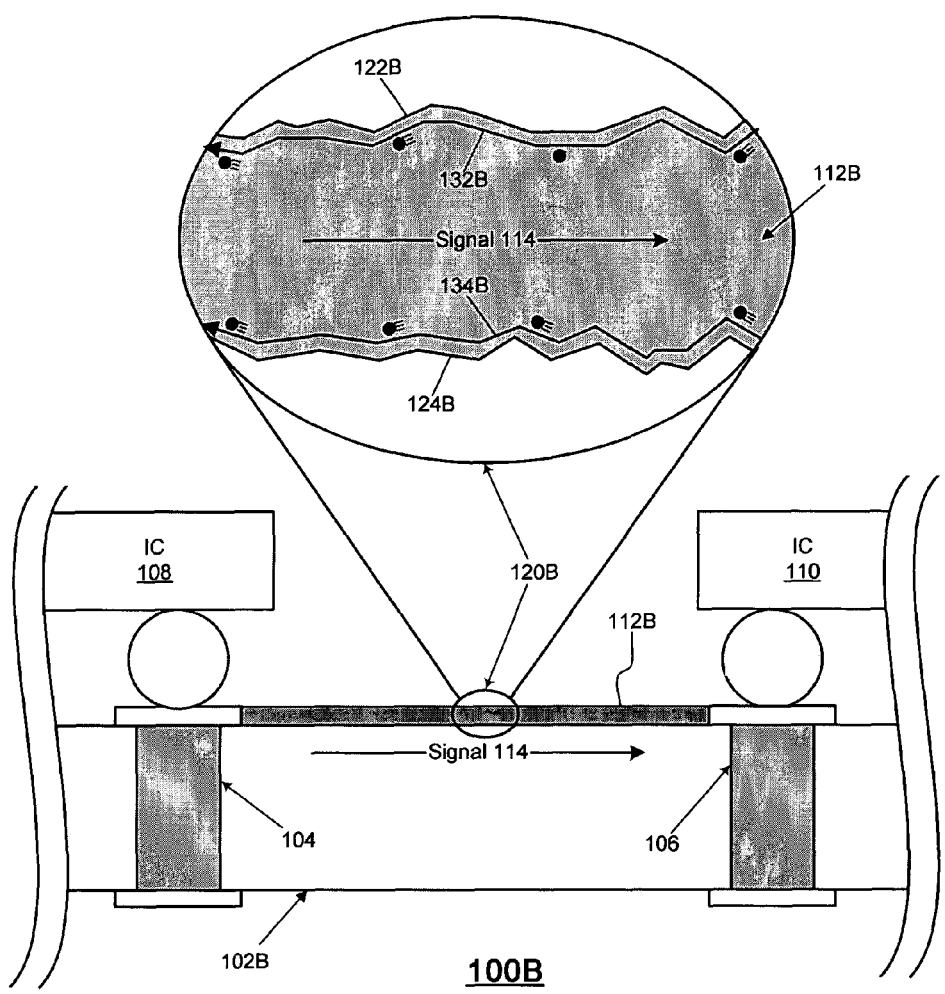
FIG. 1B is a cross-section view illustrating an exemplary PCB having a polished conductive circuit trace in accordance with at least one embodiment of the present invention.

Referring now to FIGS. 1A and 1B, an exemplary technique for improving signal performance by using polished circuit traces is illustrated in accordance with at least one embodiment of the present invention. FIG. 1A illustrates a cross-section view of an exemplary circuit module 100A including a PCB 102A having vias 104, 106 electrically connected to integrated circuits (ICs) 108, 110, respectively. In the illustrated example, the PCB 102A further includes an unpolished conductive circuit trace 112A formed on a top surface of the PCB 102A and electrically connecting the vias 104, 106 for the purpose of transmitting a signal 114. While the signal 114 may include a signal having a wide range of frequencies in accordance with at least one embodiment of the present invention, the signal 114 preferably includes a high-frequency signal. The circuit trace 112A may include any of a variety of circuit trace materials used in circuit devices, including, for example, wrought foils, electroplated foils or deposited conductive material and may include any of a variety of conductive substances, such as copper, aluminum, gold, nickel, silver and the like.

In the illustrated example, the signal 114 has a frequency such that the circuit trace 112A exhibits the skin effect at the surfaces substantially parallel to the propagation direction of the signal 114. Further, it is assumed that the surface roughness of the unpolished circuit trace 112A extends into the skin depth of the transmitted current of the signal 114 and therefore increases the mean free path of the electrons of the transmitted current that travel at or near the surface of the circuit trace 112A.

View 120A depicts an enlarged cross-section of the circuit trace 112A. As illustrated, the top surface 122A and bottom surface 124A of the circuit trace 112A exhibit significant roughness (e.g., 20-150 microinches RMS). The side surfaces (not illustrated) of the circuit trace 112A exhibit a similar surface roughness in this example. Due to the relative roughness of the respective surfaces, electrons traveling at or near the top surface 122A travel substantially along electron path 132A and electrons traveling at or near the bottom surface travel substantially along electron path 134A.

It will be appreciated that the electron paths 132A, 134A are substantially non-linear because they follow the contours of their respective rough surfaces 122A, 124A. As a result, the length of the electron paths 132A, 134A are substantially longer than the substantially linear path of an electron traveling at or near the center of the circuit trace 112A. This additional distance traveled by electrons at skin depth typically results in increased resistance and decreased signal reach and signal performance.

Referring now to FIG. 1B, a cross-section view of an exemplary circuit module 100B including a PCB 102B having the vias 104, 106 electrically connected to the ICs 108, 110, respectively, as with the PCB 102A of FIG. 1A. Unlike the PCB 102A, however, the PCB 102B includes a polished conductive circuit trace 112B formed on a top surface of the PCB 102B and electrically connecting the vias 104, 106 for the purpose of transmitting the signal 114. The circuit trace 112B may include any of a variety of circuit trace materials used in circuit devices as discussed above.

In at least one embodiment, one or more surfaces of the circuit trace 112B are polished to reduce their surface roughness. Any of a variety of techniques may be used to polish the one or more surfaces of the circuit trace 112B, including electropolishing, chemical polishing, electroplating, vacuum deposition and the like. Techniques for polishing the surfaces of a circuit trace are discussed in greater detail below. In one embodiment, the surface(s) of the circuit trace 112B are polished to have a roughness preferably of approximately 20 microinches or less, more preferably of approximately 10 microinches or less, and most preferably of approximately 5 microinches or less.

View 120B illustrates an enlarged cross-section view of the polished circuit trace 112B. As depicted, the polished top surface 122B and the polished bottom surface 124B exhibit a significantly reduced surface roughness compared to the surfaces 122A, 124A of the unpolished circuit trace 112A (FIG. 1A). Consequently, the electron paths 132B, 134B traveled by electrons at skin depth along the top surface 122B, 124B, respectively, are significantly shorter compared to the corresponding electron paths 132A, 134A of the unpolished circuit trace 112A. The reduction in the mean free path traveled by the electrons typically results in the reduction of resistance to the current of the signal 114 and, therefore, an increase in the signal reach and a decrease in signal distortion.

It will be appreciated that the improvement in the transmitted signal generally is based at least in part on whether the mean free path is lateral (i.e., along the conductor) or transverse (i.e., across the conductor). Generally, transverse smoothing provides a more significant improvement in the signal transmission than that provided by lateral smoothing. For example, in certain instances it has been found that signal improvements for lateral smoothing can result up to 20% improvement while signal improvements resulting from transverse polishing can improve 50% or more.

Figure 2:
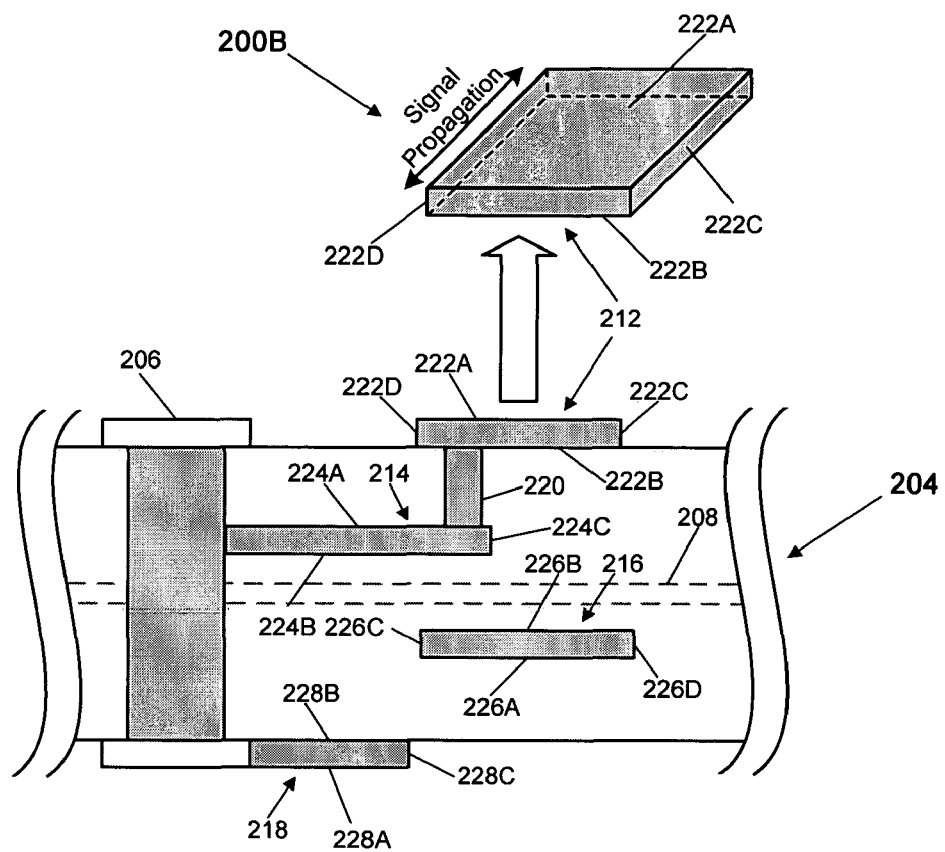
FIG. 2 is a cross-section view and plan view illustrating an exemplary PCB having a plurality of conductive circuit traces with surfaces capable of being polished in accordance with at least one embodiment of the present invention.

Referring now to FIG. 2, an exemplary multilayer PCB 204 having a variety of conductive circuit traces capable of being polished is illustrated in accordance with at least one embodiment of the present invention. In the illustrated example, the PCB 204 includes a plurality of circuit traces 212-218 at a variety of locations within the PCB 204. The circuit traces 212 and 218 are located on the top and bottom surface, respectively, of the PCB 204. The circuit traces 214 and 216 are located at interior layers of the PCB 204. The circuit traces may be connected to other features of the PCB 204. For example, the circuit trace 218 may be electrically connected to a via 206 at the bottom surface and the circuit trace 214 may be electrically connected to the via 206 and to the circuit trace 212 by way of a microvia 220.

A circuit trace generally is formed with a roughly rectangular cross-section with approximately four surfaces running substantially parallel to the propagation direction of the transmitted signal. To illustrate, view 200B depicts a plan view of a portion of the circuit trace 212. Surface 222A (i.e., the "top surface") includes the surface of the circuit trace 212 substantially parallel to the surface of the PCB 204 and distal to the center 208 of the PCB 204. Surface 222B (i.e., the "bottom surface") includes the surface of the circuit trace 212 substantially parallel to the surface of the PCB and proximate to the center 208 of the PCB 204. Surfaces 222C and 222D (i.e., the "side surfaces") include the surfaces of the circuit trace 212 that are substantially perpendicular to the surface of the PCB 204 and parallel to the direction of signal propagation. Circuit traces 214-228 have similarly arranged surfaces 224A-224C, 226A-226D and 228A-228C, respectively.

In accordance with at least one embodiment of the present invention, any or all of the surfaces of a circuit trace may be polished to improve signal performance. For example, the top surface 222A and side surfaces 222C, 222D may be polished after the circuit trace 212 is affixed to the surface of the PCB 204, while the bottom surface 222B remains unpolished to strengthen adhesion between the surface of the PCB 204 and the circuit trace 212. Alternately, the bottom surface 222B could be polished during manufacture of the material used to make the circuit trace 212 and then adhesion promoters may be used to strengthen the adhesion between the bottom surface 222B and the surface of the PCB 204.

It typically is difficult or impossible to polish the surfaces of a circuit trace embedded in an interior layer of the PCB after the circuit trace is laminated into the PCB. Accordingly, in at least one embodiment interior circuit traces may be polished prior to their lamination, as discussed in greater detail below.

Figure 3:
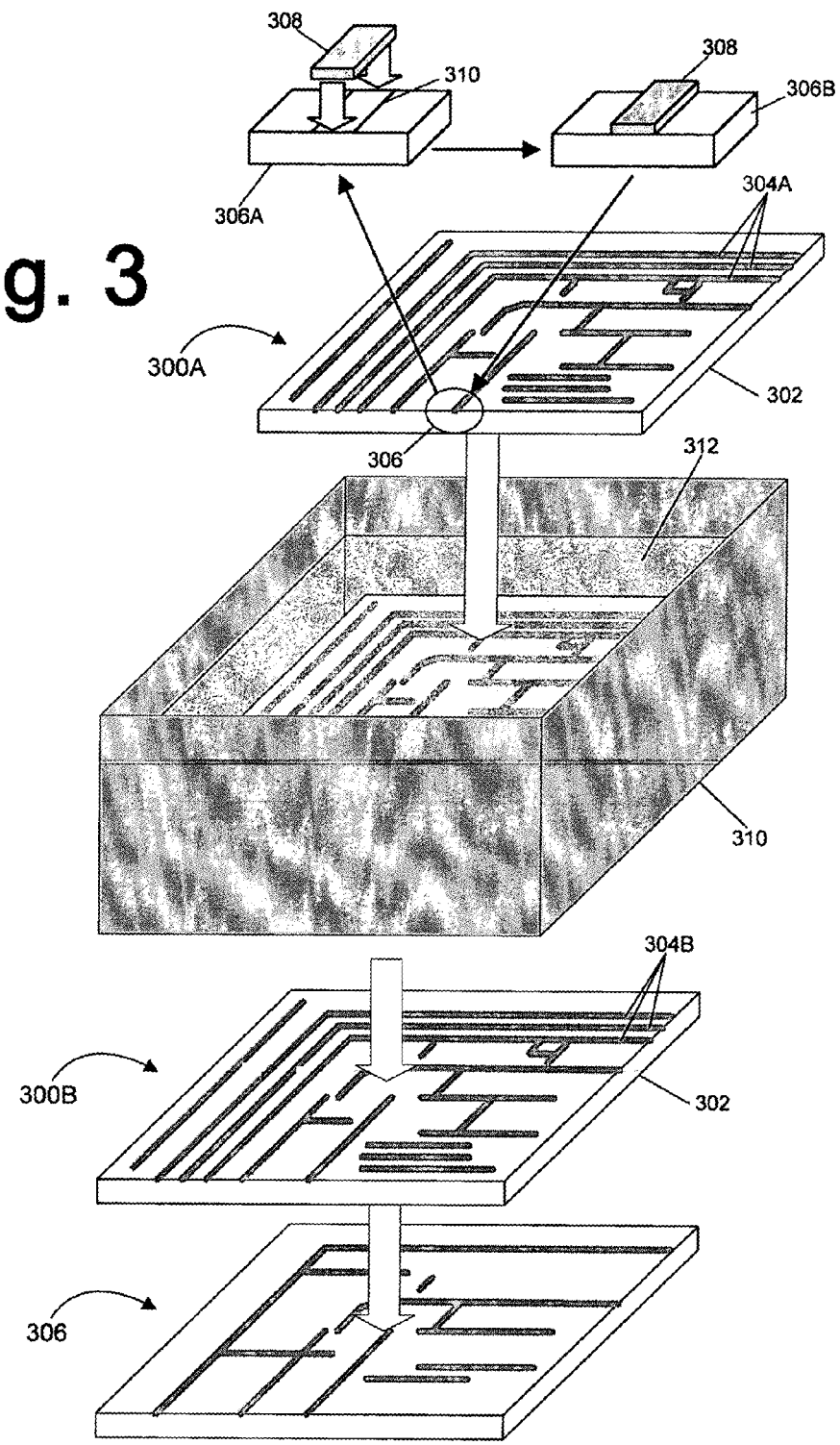
FIG. 3 is a plan view illustrating an exemplary technique for polishing one or more conductive circuit traces of a multilayer circuit board in accordance with at least one embodiment of the present invention.

Referring now to FIG. 3, exemplary techniques for polishing circuit traces and constructing a multilayer circuit board having polished circuit traces are illustrated in accordance with at least one embodiment of the present invention.

Multilayer circuit boards generally are constructed using a lamination approach whereby the circuit traces for a given layer are formed or fixed upon a substrate layer. To illustrate, a laminate 300A may be formed as a plurality of unpolished circuit traces 304A formed on or fixed to a surface of a substrate 302. View 306 illustrates an enlarged section of the laminate 300A whereby a circuit trace portion 308 is affixed to the surface of the laminate 302 at adhesion area 310 of the laminate portion 306A to generate laminate portion 306B.

The combined circuit traces/substrate layer then may be then laminated to another layer of the PCB. This lamination process typically is repeated for each layer to form the multilayer PCB. Because it is difficult if not impossible to polish circuit traces after the lamination process (other than circuit traces on the surfaces of the PCB), the polishing of the circuit traces may occur prior to lamination in accordance with at least one embodiment.

In one embodiment, the bottom surfaces of the circuit traces (i.e., the surface to contact the laminate) may be polished prior to mounting. Because normal adhesion techniques may not adequately bond to the polished bottom surface, adhesion promoters, such as very low profile adhesion promoters, may be applied to the polished bottom surfaces of the circuit traces and/or to the corresponding positions on the surface of the laminate. In certain instances, however, the bond strength offered by an unpolished bottom surface may outweigh the signal performance improvement offered by a polished bottom surface. Accordingly, one or more of the top and side surfaces may be polished while the bottom surface receives little or no finishing prior to attachment to the laminate.

After affixing the unpolished circuit traces 304A to the substrate 302, one or more metal polishing techniques may be applied to the laminate 300A to polish any or all of the top and side surfaces of the circuit traces 304A. Any of a variety of metal polishing techniques may be implemented, including, for example, electropolishing, chemical polishing, chemical mechanical polishing, mechanical polishing, electroplating, vacuum deposition, and the like.

Electropolishing generally entails submersing the laminate 300A in an electrolyte 312 (contained by a tub 310) and subject the circuit traces 304A to an electrical current. The resulting electrochemical reactions remove metal ion-by-ion from the exposed surfaces of the circuit traces. The rate of metal removal is greatest at projections on the surface of the circuit traces and lowest at depressions on the surface of the circuit traces. As a result of this disparate rate of metal removal, projections, or "peaks" on the surface are removed much more quickly than depressions, resulting in a substantially uniform surface. Chemical polishing works in a similar manner whereby the laminate 300A may be submersed in an acidic or alkaline solution that etches the surfaces of the circuit traces 304A to smooth projections on the surfaces.

In contrast to electropolishing or chemical polishing, electroplating and vacuum deposition polish the surface of a conductor by coating the surface with a layer of conductive material, where the resulting coated layer typically fills in depressions at a greater rate than it covers projections. The resulting coated surface typically is substantially uniform. Other metal finishing techniques for providing smoother surfaces in conductive materials may be used without departing from the spirit or the scope of the present invention.

As a result of the application of one or more metal finishing techniques, the laminate 300A having unpolished (or partially polished) circuit traces 304A may be converted to a laminate 300B having polished circuit traces 304B. The laminate 300B then may be laminated to an underlying laminate 306 to form part or all of a multilayer circuit board.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for improving performance of a signal transmitted via a conductive circuit trace of a circuit board, the method comprising the step of:

provided a first circuit board layer of a circuit board having a conductive circuit trace on a surface of the first circuit board layer;

laminating the first circuit board layer with a second circuit board layer; and reducing a surface roughness of at least one surface of the conductive circuit trace on the surface of the first circuit board layer using a smoothing technique prior to lamination of the first circuit board layer with the second circuit board layer so as to improve performance of a signal transmitted via the conductive circuit trace, wherein the surface roughness of the at least one surface is reduced to no more than 20 microinches root-mean-squared (RMS), wherein the smoothing technique comprises at least one of a lateral smoothing technique and a transverse smoothing technique, the lateral smoothing technique reducing surface roughness in a direction along the conductive circuit trace and the transverse smoothing technique reducing surface roughness in a direction across the conductive circuit trace;

wherein the step of reducing the surface roughness comprises vacuum depositing conductive material on the at least one surface.

2. The method as in claim 1, wherein the surface roughness of the at least one surface is reduced to no more than 10 microinches root-mean-squared (RMS).

3. The method as in claim 1, wherein the surface roughness of the at least one surface is reduced to no more than 5 microinches root-mean-squared (RMS).

4. The method as in claim 1, wherein the at least one surface of the conductive circuit trace includes one of a group consisting of: a surface parallel and distal to a surface of the circuit board; a surface parallel and proximal to the surface of the circuit board; and a surface perpendicular to the surface of the circuit board.

5. The method as in claim 1, wherein the conductive circuit trace is formed on the surface of the circuit board layer.

6. The method as in claim 1, wherein the conductive circuit trace is affixed to the surface of the circuit board layer.

7. The method as in claim 1, wherein the smoothing technique is a lateral smoothing technique.

8. The method as in claim 1, wherein the smoothing technique is a transverse smoothing technique.

* * * * *